United States Patent
Salomon et al.

(10) Patent No.: US 6,408,090 B1
(45) Date of Patent: Jun. 18, 2002

(54) METHOD FOR POSITION RECOGNITION OF COMPONENTS EQUIPPED ON A SUBSTRATE IN AN AUTOMATIC EQUIPPING UNIT

(75) Inventors: Werner Salomon, Freising; Jochen Prittmann, Munich; Hans-Horst Grasmueller, Mammendorf, all of (DE)

(73) Assignee: Siemens Production and Logistics System Aktiengesellschaft, Nürnberg (DE)

(*) Notice: Subject to any disclaimer, the term of this patent is extended or adjusted under 35 U.S.C. 154(b) by 0 days.

(21) Appl. No.: 09/209,988

(22) Filed: Dec. 11, 1998

(30) Foreign Application Priority Data

Sep. 28, 1998 (DE) .......................... 198 44 456

(51) Int. Cl.⁷ ................................................ G06K 9/00
(52) U.S. Cl. ......................... 382/145; 382/153; 348/87
(58) Field of Search ................................ 382/141–149, 382/150, 151, 153; 348/86, 87, 125, 126, 127; 356/243, 243.1; 250/559.34; 156/356

(56) References Cited

U.S. PATENT DOCUMENTS

| | | | |
|---|---|---|---|
| 5,003,692 A | * | 4/1991 | Izumi et al. |
| 5,838,434 A | * | 11/1998 | Skramsted et al. .......... 356/243 |
| 5,900,106 A | * | 5/1999 | Takahashi et al. .......... 156/356 |
| 5,903,662 A | * | 5/1999 | DeCarlo ...................... 382/151 |
| 5,946,408 A | * | 8/1999 | Honda ......................... 382/149 |
| 5,953,447 A | * | 9/1999 | Jin .............................. 382/145 |
| 5,963,662 A | * | 10/1999 | Vachtsevanos et al. ..... 382/150 |
| 6,008,840 A | * | 12/1999 | Jin et al. ........................ 348/87 |
| 6,028,319 A | * | 2/2000 | Tsai ....................... 250/559.34 |
| 6,151,407 A | * | 11/2000 | Conlon et al. .............. 382/153 |
| 6,167,149 A | * | 12/2000 | Tsujikawa et al. .......... 382/147 |
| 6,205,238 B1 | * | 3/2001 | Ma ............................. 382/146 |

FOREIGN PATENT DOCUMENTS

| | | | |
|---|---|---|---|
| DE | 36 18 590 | * | 12/1986 |
| DE | 41 21 404 | * | 1/1993 |
| EP | 0 449 481 | | 10/1991 |
| WO | WO 97/22238 | * | 6/1987 |

* cited by examiner

*Primary Examiner*—Joseph Mancuso
*Assistant Examiner*—Vikkram Bali
(74) *Attorney, Agent, or Firm*—Schiff Hardin & Waite

(57) ABSTRACT

The position recognition of components placed on substrates has hitherto ensued visually outside the automatic equipping unit. This is complicated and the components lying at the bottom cannot be seen given placement of a number of components above one another. In the method disclosed herein, the position of the placed components in the automatic equipping unit is identified shortly after the actual placement process with a position sensor located in the automatic equipping unit. As a result, errors are recognized early and the automatic equipping unit can therefore be more easily adjusted in view of the positional precision. A camera with a following image evaluation unit is employed as the position sensor.

6 Claims, 1 Drawing Sheet

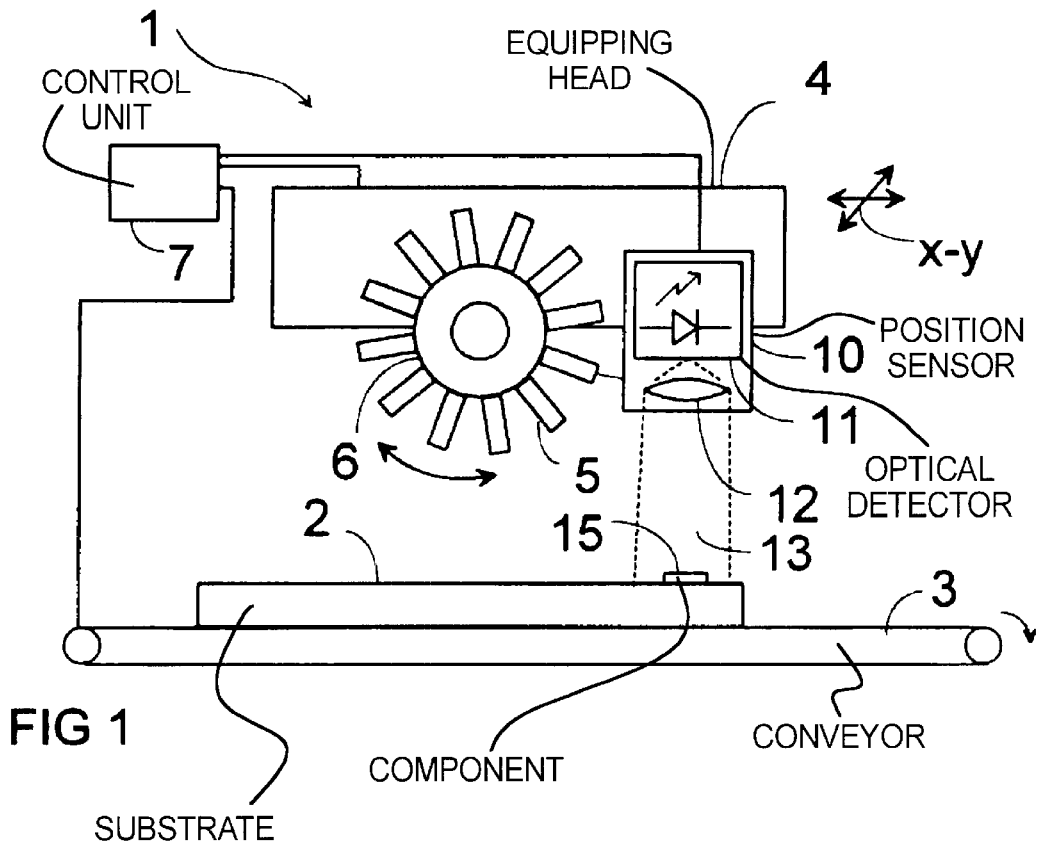
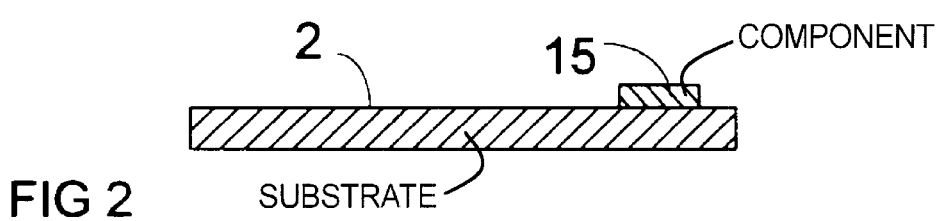
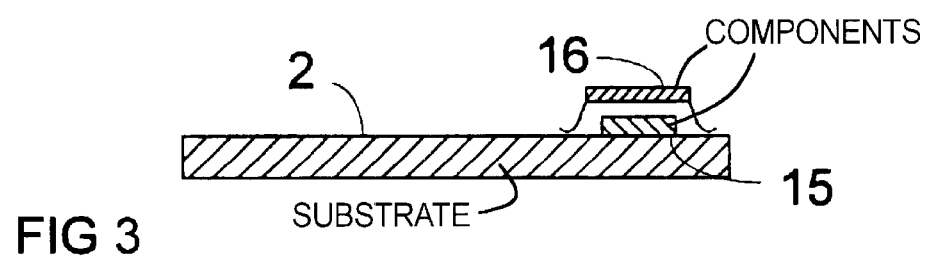

METHOD FOR POSITION RECOGNITION OF COMPONENTS EQUIPPED ON A SUBSTRATE IN AN AUTOMATIC EQUIPPING UNIT

BACKGROUND OF THE INVENTION

1. Field of the Invention

The present invention is directed to a method for positioning recognition of components equipped on a substrate in an automatic equipping unit.

2. Description of the Prior Art

In automatic equipping of substrates (for example, printed circuit boards or ceramic substrates with SMD (surface mounted device components), the individual components are taken from a delivery device with an equipping head and are then positioned on the substrate in a predetermined position.

A check to determine whether all of the components were in fact positioned in their respective predetermined positions ensues indirectly outside the automatic equipping unit. A faulty position of a component after the end of the overall equipping process is thus represented, for example, by a negative electrical function test, i.e. the overall circuit board does not function as intended. At this point, it is virtually impossible to pinpoint the erroneous placement which caused error, and the substrate can no longer be used.

The position of some of the components after the equipping in an automatic equipping unit is checked visually in separate machines outside the automatic equipping unit. In the meantime, however, further components are placed over components that have already been placed on the substrate; the components lying at the bottom are then no longer accessible for a visual check so that, for example, complicated x-ray inspection devices must used.

SUMMARY OF THE INVENTION

It is an object of the present invention to provide a simple method for position recognition of components on a substrate which allows the components to be checked early for their actual position.

The above object is achieved in accordance with the principles of the present invention in a method for position recognition of components placed on a substrate in an automatic equipping unit, wherein a predetermined position of the components is stored in a control unit of the automatic equipping unit before placement of the components, the actual position of the components on the substrate is identified using a sensor mounted in the automatic equipping unit, the actual position is compared to the predetermined position, and given agreement, within a predetermined range, between the predetermined position and the actual position, the equipping process is continued, otherwise an error message is generated.

By comparing the actual (placed) position to a predetermined position directly in the automatic equipping unit following the equipping process, separate machines are not required for visual checking. The equipping process is therefore not interrupted and, for example, separate programs for the integrated operation of the separate machine and the automatic equipping unit are not needed.

An additional advantage is that a faulty position is already recognized early, and thus the faulty substrate can be eliminated before additional, cost-intensive equipping processes or other processes as well (soldering) are undertaken.

As warranted, a positional correction—for example, manual—can also be implemented, or the faulty equipping procedure can be repeated given an early recognition of the faulty position.

In an embodiment of the method, a camera having a following image evaluation unit is used as a position sensor. Such sensors as well as the methods for image analysis are technologically mature and are known and allow the position recognition in a simple way.

The method can be used to particular advantage when a component already placed on the substrate is to be covered by another component. The position identification of the first-placed component can then be undertaken while that component is still visible, before placement of the further component over the previously-placed component. In this regard, the term "components" means any type of item which is placed on the substrate, including, for example, cooling elements such as cooling plates as well as electronic components. For saving space, larger components may be placed over smaller components that have already been equipped. As a result of the inventive method, the position of the components lying at the bottom can be identified before the placement of the components lying thereabove, so that complicated x-ray inspections are not needed.

The position sensor can be moved together with the equipping head, allowing every component placed on the substrate to come into the field of view of the sensor. A complicated design of a sensor is thereby avoided.

In a preferred embodiment of the method, the sensor is also employed for identifying the position of the substrate in the automatic equipping unit, so that only one sensor is required for these two processes resulting in cost savings.

The method is preferably employed for optimizing (fine adjustment of) the positional precision of the automatic equipping unit by upon each comparison of the actual position with the predetermined position, conducting a procedure to improve a subsequent placement of another component on the substrate. The positional precision in automatic equipping units can thus be improved from component to component with known optimization (neural network training) algorithms.

DESCRIPTION OF THE DRAWINGS

FIG. 1 is a schematic side view of an automatic equipping unit constructed an operating in accordance with the invention.

FIG. 2 is a schematic section through a substrate equipped with a component in accordance with the invention.

FIG. 3 is a schematic section through a substrate with two components equipped on top of another in accordance with the invention.

DESCRIPTION OF THE PREFERRED EMBODIMENTS

Using an automatic equipping unit 1 shown in FIG. 1, components 15 are taken from delivery units (not shown) with the assistance of holder devices 5 (for example, suction pipettes) and are positioned (placed) on a substrate 2 in a predetermined position. The substrate 2 is transported into the automatic equipping unit with a conveyor device 3. The holding devices 5 are secured via a mount 6 to an equipping head 4 of the automatic equipping unit 1 that—monitored by a control unit 7—moves in X-Y directions parallel to the substrate 2. As a result, all positions on the substrate 2 can be reached. A position sensor 10, for example a camera, composed of an optical detector 11, an optical imaging element 12 and an image evaluation unit (not shown which, for example, can be arranged in the control unit 7) acquires at least a portion of the placed component 15 in its field of view 13. When the position sensor 10 is secured to the equipping head 4, its field of view 13 can reach every point of the substrate 2 in the automatic equipping unit 1. Sensors such as the position sensor 10 are also employed, for example, for identifying the position of the substrate in the automatic equipping unit 1. The identified position of the substrate 2 is then already employed during the equipping process for the exact positioning of the components 15 on the substrate 2.

The position of placed components 15 is identified with the assistance of the position sensor 10. For checking whether the component is located in the predetermined position and, whether it is even present, a simple height sensor, for example a commercially obtainable triangulation sensor, is suitable for the position sensor 10.

An identification of which components 15 are to be checked in detail for their position can be stored in the control unit 7 together with the predetermined position, before the implementation of the equipping process. The image evaluation unit compares the predetermined position with the actual (sensed) position. Given a positive comparison result, the equipping process is continued; given a negative comparison result, an error message is generated. The error message can then, for example, allow the improperly equipped substrate to be recognized early as such, and be removed from further processing. Cost-intensive, further process steps are thus saved.

The method is especially advantageously employed when, as schematically shown in section in FIGS. 2 and 3, a further component 16 (for example, a larger component or a cooling plate) is placed over a component 15 which already has been placed. As a result of the position recognition in the automatic equipping unit 1, it is possible to implement a position recognition of the lower component 15 before the placement of the further component 16. This otherwise would have been possible only with complicated methods, for example x-ray methods.

The position recognition of the placed components 15 in the automatic equipping unit 1 can also be employed in order to enhance the positional precision of the automatic equipping unit 1 during the equipping process. When, for example, the control unit 7 regularly identifies deviations between the predetermined position and the actual position of the components 15, the equipping process can be adapted with known methods, such as employing neural network training, until the predetermined and actual positions coincide better.

Although various changes and modifications to the presently preferred embodiments described herein will be apparent to those skilled in the art, such changes and modifications can be made without departing from the spirit and scope of the present invention and without diminishing its attendant advantages. Therefore, the appended claims are intended to cover such changes and modifications.

What is claimed is:

1. A method for position recognition of components placed on a substrate comprising the steps of:
    in a plurality of components, identifying certain components as pre-identified components requiring more precise positioning than other components in said plurality;
    in an equipping process after said certain components have been pre-identified, picking up a component, as a picked-up component from among said plurality of components with an equipping head of an automatic equipping unit;
    in a control unit of said automatic equipping unit, storing a predetermined position at which said picked-up component is to be placed on a substrate;
    placing said picked-up component at an actual position on said substrate using said equipping head;
    using a position sensor mounted on said automatic equipping unit after placement of said picked-up component on said substrate, only if said picked-up component is one of said pre-identified components, identifying said actual position of said pre-identified component on said substrate after placing said pre-identified component on said substrate;
    comparing said actual position to said predetermined position; and
    if said predetermined position and said actual position coincide within a predetermined range, continuing said equipping process, and if said predetermined position and said actual position are outside of said predetermined range, generating an error message.

2. A method as claimed in claim 1 wherein the step of mounting a position sensor on said automatic equipping unit comprises mounting a camera connected to an image evaluation unit on said automatic equipping unit as said position sensor.

3. A method as claimed in claim 1 wherein said component comprises a first component, and wherein said equipping process includes placing a second component on said substrate over said first component, and wherein the step of identifying the position of said first component on said substrate is undertaken before placing said second component over said first component.

4. A method as claimed in claim 1 wherein the step of mounting said position sensor on said automatic equipping unit comprises mounting said position sensor to said equipping head so that said position sensor and said equipping head move together.

5. A method as claimed in claim 1 comprising the additional step of employing said position sensor for identifying a position of said substrate relative to said equipping head.

6. A method as claimed in claim 1 comprising the additional steps of, upon each comparison of said actual position with said predetermined position, conducting a procedure to improve a subsequent placement of another component on a substrate.

* * * * *